United States Patent [19]

Dingwall

[11] 4,182,961
[45] Jan. 8, 1980

[54] INHIBITABLE COUNTER STAGE AND COUNTER

[75] Inventor: Andrew G. F. Dingwall, Bridgewater, N.J.

[73] Assignee: RCA Corporation, New York, N.Y.

[21] Appl. No.: 832,463

[22] Filed: Sep. 12, 1977

[30] Foreign Application Priority Data

Sep. 27, 1976 [GB] United Kingdom ............... 40028/76

[51] Int. Cl.² ..................... H03K 23/08; H03K 21/32; H03K 21/36; H03K 3/353
[52] U.S. Cl. ............................ 307/225 C; 307/200 B; 307/220 C; 307/279; 307/289; 328/48; 328/99
[58] Field of Search ........... 307/220 C, 221 C, 223 C, 307/224 C, 225 C, 289, 279, 291, 200 B; 328/99, 48

[56] References Cited

U.S. PATENT DOCUMENTS

| 3,657,557 | 4/1972 | Smith et al. | 307/225 C |
|---|---|---|---|
| 3,823,551 | 7/1974 | Riehl | 307/225 C X |
| 3,833,822 | 9/1974 | Carbrey | 307/225 C |
| 3,930,169 | 12/1975 | Kuhn, Jr. | 307/225 C |
| 4,002,933 | 1/1977 | Leuschner | 307/291 |
| 4,114,049 | 9/1978 | Suzuki | 307/225 C |

OTHER PUBLICATIONS

Suzuki, 1973—*IEEE-ISSCC, Digest of Technical Papers,* pp. 58-59; 2/14/73.

Primary Examiner—Larry N. Anagnos
Attorney, Agent, or Firm—H. Christoffersen; Henry I. Schanzer

[57] ABSTRACT

A counter stage having a master section coupled to a slave section in which the transfer of signals between the master and the slave is selectively inhibited. In one embodiment of the invention, an inhibit transmission gate is logically "ANDED" with a clocked transmission gate between the master and slave sections of a counter stage. When the inhibit transmission gate is enabled, the counter stage operates normally. When the inhibit transmission gate is disabled, the states of the master and slave sections cannot change and the count in the stage does not advance. In this and other embodiments, clocking signals are continuously applied to the master-slave sections of a counting stage while transfer of data between the two sections is selectively inhibited. In still other embodiments, the clocking signals to a master-slave counter stage are selectively inhibited to prevent change in the stage.

17 Claims, 15 Drawing Figures

INHIBITABLE COUNTER STAGE AND COUNTER

This invention relates to counter stages in which the transfer of information between the master section and the slave section is selectively inhibited, and to counters employing such counter stages.

It is known to set or reset a counter stage in order to place it in a given state. However, setting or resetting a counter stage normally requires that the voltage levels at one or more of its circuit points be changed. The transition time to go from one voltage level to another is finite, and the ensuing propagation delays and settling times are factors in limiting the maximum speed of operation.

Applicant recognized that in some applications a counter stage may be inhibited from counting rather than being reset (or set). A counter stage embodying the invention includes means for selectively inhibiting the counter stage and preventing a change in the voltage levels at its outputs during inhibit. Since such inhibiting prevents changes in the voltage levels of the circuit, higher operating speeds are obtainable.

In the accompanying drawings,

FIGS. 8A and 9A are block diagrams of still other inhibitable counters embodying the invention.

Figure 1A:
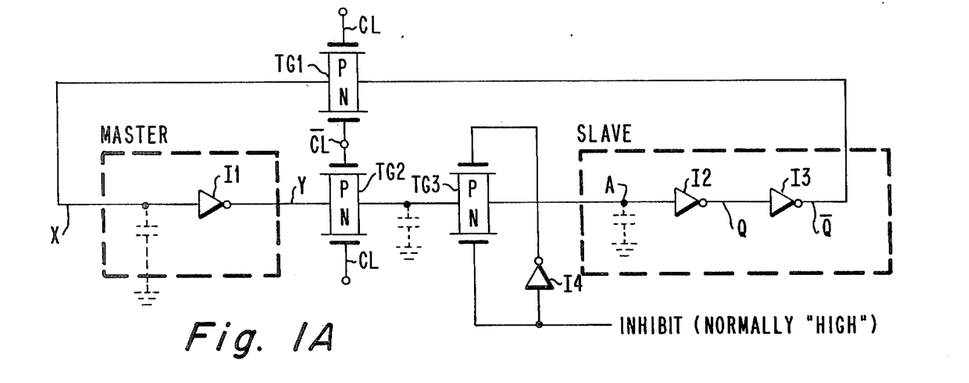
FIG. 1A is a schematic diagram of an inhibitable dynamic counter stage embodying the invention.

The dynamic counter stage of FIG. 1A includes a master section comprised of inverter I1 and a slave section comprised of cascaded inverters I2 and I3. The output (Y) of inverter I1 (which is also the output of the master) is coupled via "feed-forward" dual transmission gate TG2 and inhibit transmission gate TG3 to the input, A, of inverter I2 (which is also the input of the slave). The output of inverter I2, denoted as the Q, or "true", output of the slave is directly applied to the input of inverter I3, whose output is denoted as the $\overline{Q}$, or "false", output of the slave. The $\overline{Q}$ output of inverter I3 is coupled via "feedback" transmission gate TG1 to the input (X) of inverter I1 (which is also the input of the master). This circuit differs basically from prior art dynamic circuits in the addition of the inhibit gate TG3. The significance of this addition is discussed below.

In the circuit of FIG. 1A, the clock signal (CL) is applied to the P transistor of TG1 and to the N transistor of TG2, and the complement $\overline{CL}$ of the clock is applied to the N transistor of TG1 and to the P transistor of TG2. Consequently, TG1 is turned-on (enabled) when CL is low ($\overline{CL}$ is high), and is turned-off (disabled) when CL is high. TG2 is enabled when CL is high and is disabled when CL is low. The alternate enabling of TG1 and TG2 ensures that when information is being transferred from the slave to the master, no information is transferred from master to slave and vice-versa. Note also that TG1 and TG2 are always clocked and there is no delay in turning them on and off.

The conductivity of TG3 is controlled by an inhibit signal applied to the gate of its N transistor, and applied via inverter I4 to the gate of its P transistor. The inhibit signal is normally "high", hence TG3 is normally enabled.

When TG3 is enabled, the circuit of FIG. 1A functions as a binary divider. Its operation is well known and need not be described in great detail. As shown in the waveform diagram of FIG. 1B, in the absence of an inhibit signal (INH-high) Q and $\overline{Q}$ change state whenever CL makes a positive going transition; Q and $\overline{Q}$ vary at one half the frequency of CL. When CL goes negative, the output $\overline{Q}$ of the slave is applied to the input X of the master, and when CL goes positive, the output Y of the master is applied via the conduction paths of TG2 and TG3 to the input (A) of the slave.

When the inhibit (INH) signals goes negative (also defined as being "applied" or "present"), TG3 is disabled and the further transfer of information from the master to the slave is blocked. Node A remains charged to the level applied to the node just prior to TG3 being disabled.

Figure 1B:
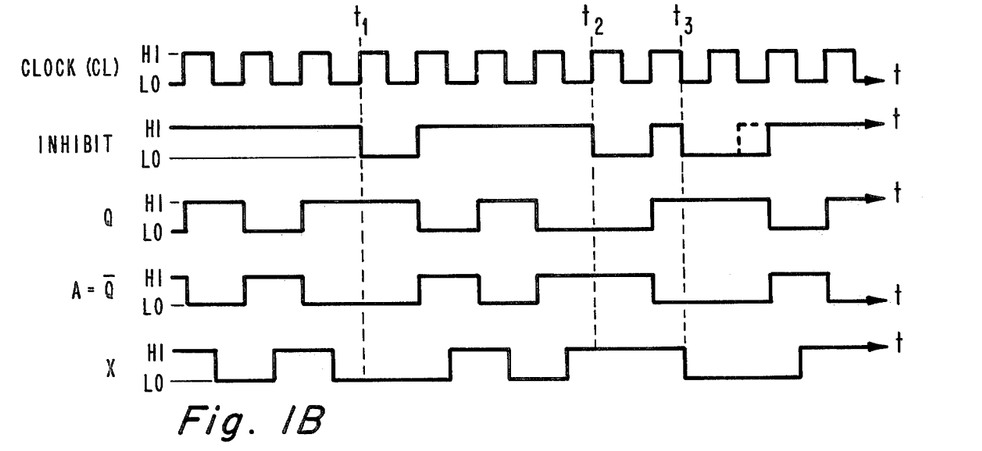
FIG. 1B is a drawing of waveforms showing the response of the circuit of FIG. 1A to clocking and inhibiting signals.

As shown in FIG. 1B, whether the inhibit is applied when Q is high at time $t_1$ or when Q is low at time $t_2$, Q and $\overline{Q}$ remain at the voltage levels they had prior to inhibit going low. Assume that at time $t_1$, Q is to be set at Q high and that at time $t_2$, it is to be set to Q low. Since at times $t_1$ and $t_2$, Q and $\overline{Q}$ are already charged to these levels, no voltage levels have to be changed and no nodes have to be charged or discharged. The counter stage is "already" in the state in which it is to be placed. Hence, the operation equivalent to settling or resetting of the stage for the assumed conditions is extremely fast since there is substantially no delay (except for the turn-off of the transistors of TG3).

Inhibiting data transfer when the master output is coupled to the slave input at times $t_1$ and $t_2$, (when the feedback gate TG1 is turned off and TG2 is about to be turned on) also prevents the input X and output Y of the master from changing at the inception of and during the inhibit period. Thus, if an inhibit pulse is first applied (i.e. INH goes negative) when TG1 is disabled, none of the inputs and outputs of the counter stage change state. If an inhibit signal is applied when the slave output is coupled to the master input, (e.g. at time $t_3$ in FIG. 1B when TG1 is to be turned on and TG2 is to be turned-off) then the X input (and hence the Y output) of the master can change levels when the inhibit is first applied. However, for the duration of the inhibit period, X and Y also cannot change state. But, the slave input and outputs (A, Q and $\overline{Q}$) do not change state (even when the inhibit is first applied), and these are the nodes of the stage which are coupled to other counting stages.

Figure 7A:
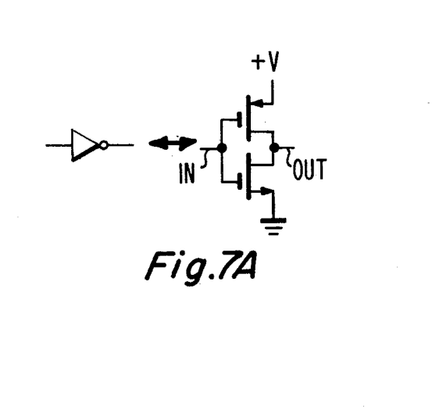
FIGS. 7A, 7B, 7C are schematic diagrams of inverters and two-input NOR and NAND gates employing insulated-gate field-effect transistors (IGFETs) of complementary conductivity type which may be used to implement the logic functions shown in logic block form in the other FIGURES.

In the dynamic counter of FIG. 1A, reliance is placed on the storage of charge at the inputs X and A of the master and the slave. Inverters I1 and I2 may be complementary inverters employing IGFETs as shown in FIG. 7A. These inverters are characterized by an extremely high input impedance and as shown with dashed lines in FIG. 1A there is some distributed capacitance associated with their input nodes. Assume, for example, that the shortest discharging (or charging) time constant for the input nodes is $\tau_p$. Hence, by limiting the lowest clock frequency to be generally greater than $1/\tau_p$ and by limiting the longest inhibit period to be less than $\tau_p$ reliable operation is obtained.

Although the inhibit gate is shown connected between the output of the master and the input to the slave it could as well have been connected in the feedback loop between the slave output and the master input.

Figure 2:
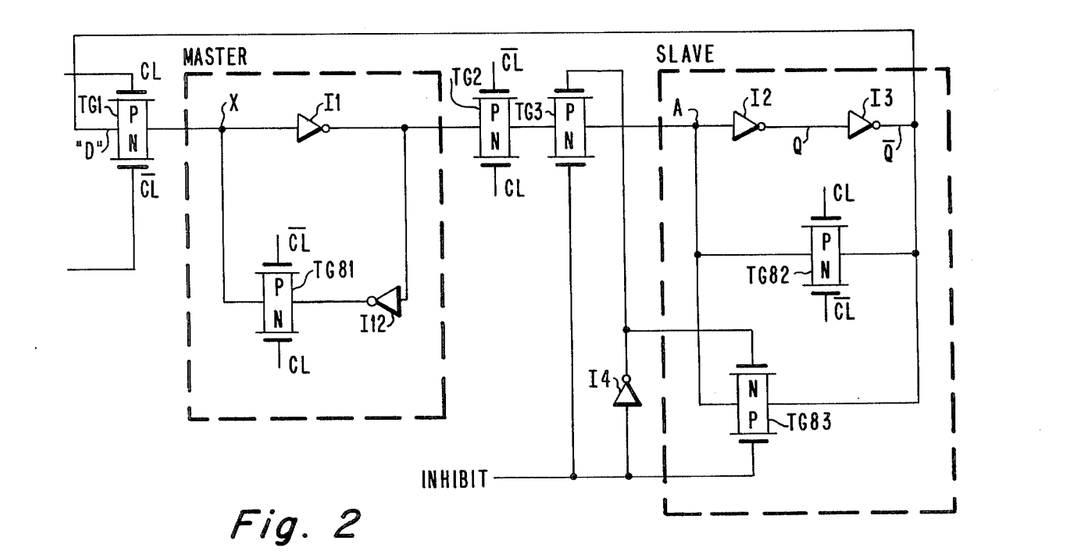
FIG. 2 is a schematic diagram of an inhibitable static counter stage embodying the invention.

By causing the master section to latch up when the feedback gate TG1 is disabled, and causing the slave section to latch up when the feedforward gate TG3 is disabled, the dynamic stage of FIG. 1A can be made into an inhibitable static stage as shown in FIG. 2.

In FIG. 2 the master stage includes two inverters I1, I12) latched via transmission gate TG81. The slave section includes two inverters (I2, I3) latched via transmission gates TG82 and/or TG83. As before, the conduction paths of a feedforward gate TG2 and an inhibit gate TG3 are connected in series between the output of inverter I1 and the input A of inverter I2, and a feedback gate TG1 is connected between the $\overline{Q}$ output and the input X of inverter I1. The output of inverter I2 is connected to the input of inverter I3, and the output of inverter I3, is coupled via transmission gates TG82 or TG83 to the input of inverter I2. TG83 is turned on when inhibit gate TG3 is turned-off in order to cause the slave section to latch and to thereby statically store the Q and $\overline{Q}$ levels. TG3 is controlled by an inhibit signal as in FIG. 1A.

TG2 and TG81 are turned on when CL is high and are turned-off when CL is low. TG1 and TG82 are turned-on when CL is low and are turned-off when CL is high. Thus, as in the circuit of FIG. 1A, the feed-forward and feedback gates are alternately enabled; the inhibit gate is selectively disabled.

The operation of the circuit of FIG. 2 is similar to that of FIG. 1A and need not be detailed. The use of the latches in the master and slave sections lowers the highest frequency of operation when compared to the circuit of FIG. 1A. But, due to its static configuration, the circuit of FIG. 2 may be operated down to the DC level.

In FIGS. 1 and 2, and inhibit transmission gate (TG3) is logically "AND'ed" with a clocked transmission gate (TG2) between the master and slave sections of the counter. When the inhibit transmission gate is turned-on, the counters operate normally. When, however, the inhibit gate is turned-off, the master section is unable to change the state of the slave section and so the count does not advance. Because the levels in the master and slave are not being reset, only being prevented from changing from an existing state, inhibiting is much faster than resetting, which usually relies on the turning-on of transistors to clamp nodes to some fixed voltage level. Therefore, an inhibitable counter stage is extremely suitable for use in high speed counters, as demonstrated in FIG. 3, which shows an application of inhibitable counting in a circuit which may be used in a frequency synthesizer.

Figure 3:
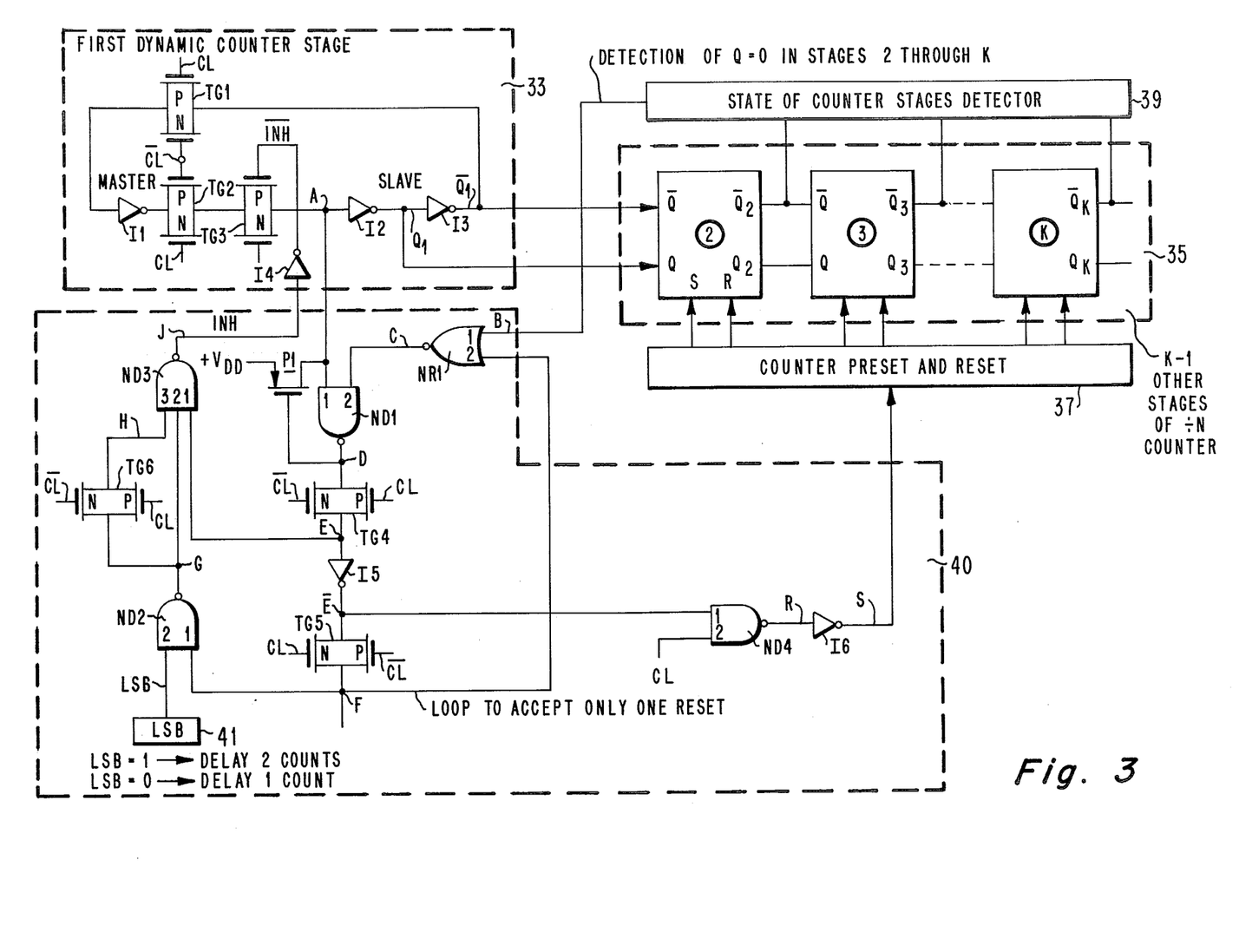
FIG. 3 is a partial schematic, partial block diagram of a divide-by-N counter embodying the invention whose first stage is an inhibitable dynamic stage.

The circuit of FIG. 3 includes a divide-by-N ripple counter 35 configured to count down. The first stage 33 of the K stages of counter 35 is a dynamic stage of the type shown in FIG. 1. This type is much faster than a static counter stage due to fewer number of stage delays in the counting mode of operation. Stages 2 through K of counter 35 are static stages of the type shown in FIG. 2 but without the circuitry for inhibit (i.e. the inhibit gate is replaced with a short circuit and I41 and TG83 are removed). The $Q_1$ and $\overline{Q}_1$ outputs of the first stage are applied to the clocking inputs $\phi$ and $\overline{\phi}$ of the second stage ② of counter 35. The Q and $\overline{Q}$ outputs of each succeeding stage (except for the last) are connected to the clocking inputs of the next higher order stage (making this a ripple counter). For the assumed configuration, the Q and $\overline{Q}$ outputs of each stage change state when the signal applied to its "true" or unprimed clocking input (CL or $\phi$) makes a positive going transition.

Stages 2 through K of counter 35 may be preset (i.e. programmed) to a selected count by means of Counter Preset and Reset circuit 37. Thus, counter 35 is a programmable counter. The states of stages 2 through K may be detected by means of a Detector 39 whose inputs are connected to the outputs of counter 35. Detector 39 may be arranged to decode a particular state and to provide an output indicative of when stages 2 through K of the counter are in that particular state. (Programmable counters including Presetting and Detector means are well known in the art and any one of a number of these could be used in this application. Therefore, the circuitry of blocks 37 and 39 is not detailed). In this application a desired count is jammed into the counter 35 via Counter Preset circuitry 37 and the counter "counts down" to zero with the higher order stages reaching the state Q="zero" before the lower order stages. The state of the counter stages is detected by means of Detector 39, having an output denoted as "B" which goes to "zero" when all of stages 2 through K reach zero.

An auxiliary counting arrangement 40 is provided to detect when the Q outputs of all the stages of counter 35 are at the particularly desired state, zero in this case, i.e. when output B reaches zero, and to then inhibit the first stage of the counter for one or two cycles to provide time for resetting and/or presetting stages 2-to-K of counter 35.

In the absence of counter 40, the condition of the counter 35 stages would have to be detected and stages 2 through K would have to be preset during one cycle of the clock applied to the first counter stage. The clock (CL) frequency may be of the order of 20 MHz, or more, making it unreliable and sometimes impossible to detect the output condition, and then preset the counter within one cycle of the input clock. Accordingly, such operation might lead to the loss of counts and errors in the division ratio.

The circuit of FIG. 3 includes auxiliary counter 40 which counts m cycles while the first stage is inhibited and the other stages of counter 35 are being reset. The m counts of the auxiliary counter are added to the N counts of counter 35. Thus, the combination of the two counters divides the clock frequency by N+m, where N is the count in the counter 35 and may be any number between 0 and $2^K$ and m is the count in the auxiliary counter 40. In FIG. 3, m is a count of 1 or 2 as determined by LSB control 41.

Auxiliary counter 40 includes NAND gate ND1 and NOR gate NR1 which detect a particular condition of stages 1 through K of counter 35. In response to an all "0" condition of the true outputs of counter 35, a counting cycle is initiated in the auxiliary counter comprised of a shift register loop which includes clocked transmission gates TG4, TG5, TG6, inverter I5 and NAND gates ND2 and ND3. A reset circuit comprised of NAND gate ND4 and inverter I6 determines when Counter Preset 37 is energized. A LSB control 41 modifies the count (length or delay) of the counting loop and determines whether the auxiliary counting loop counts (delays) one or two pulses, and thus inhibits the first stage for one or two CL cycles. To inhibit the first dynamic stage for one cycle, the LSB input to ND2 is set equal to zero. With LSB=0, the outputs G and H remain high and gates ND2 and TG6 are effectively out of the loop. To inhibit the first dynamic stage for two cycles, the LSB input to ND2 is set equal to "1" or high. As detailed below, for this condition TG5, ND2 and TG6 function to maintain the inhibit signal J high for an additional clock cycle.

Figure 4A:
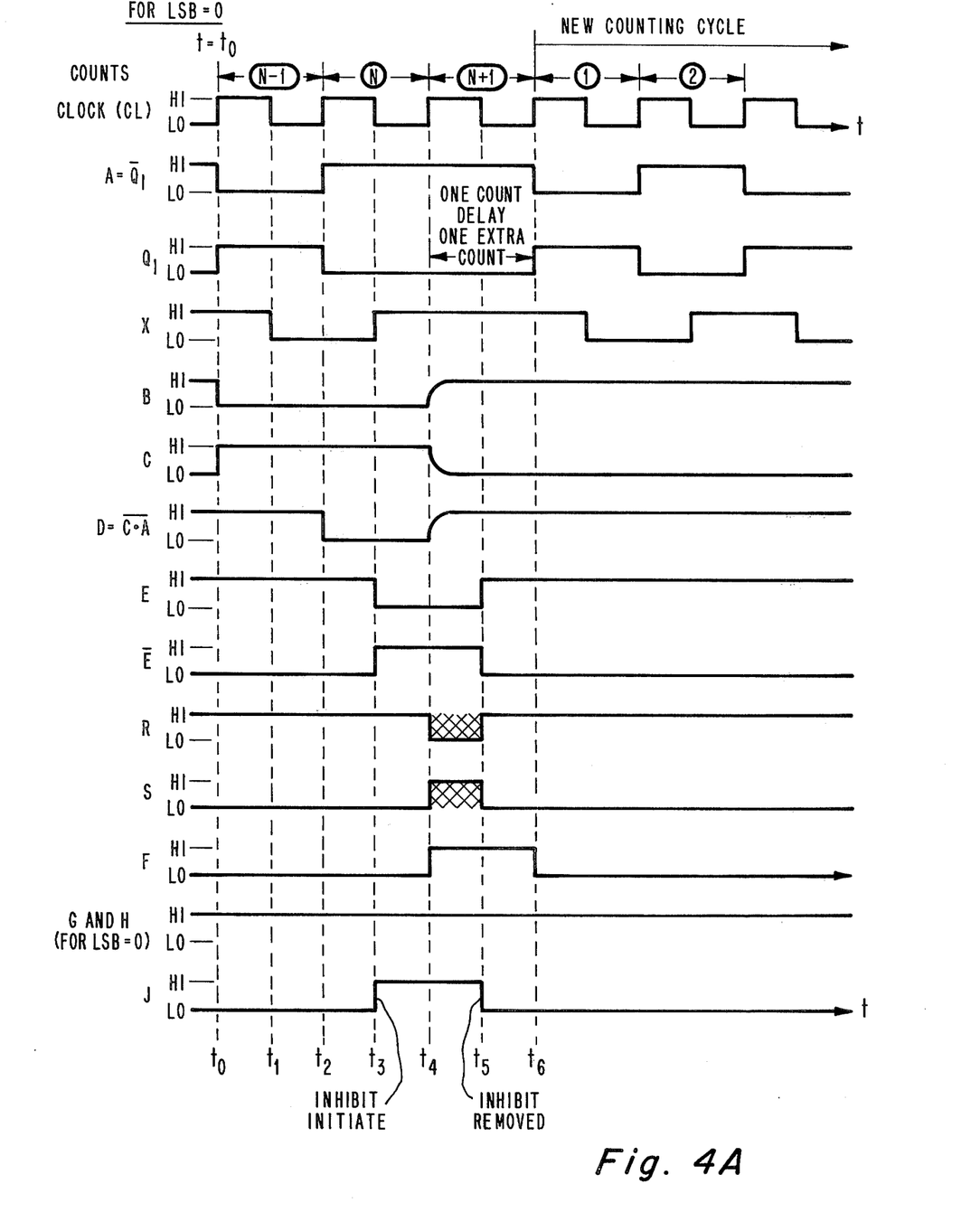
FIGS. 4A and 4B are drawings of waveshapes associated with various nodes of FIG. 3 for two different counting arrangements.
Figure 4B:
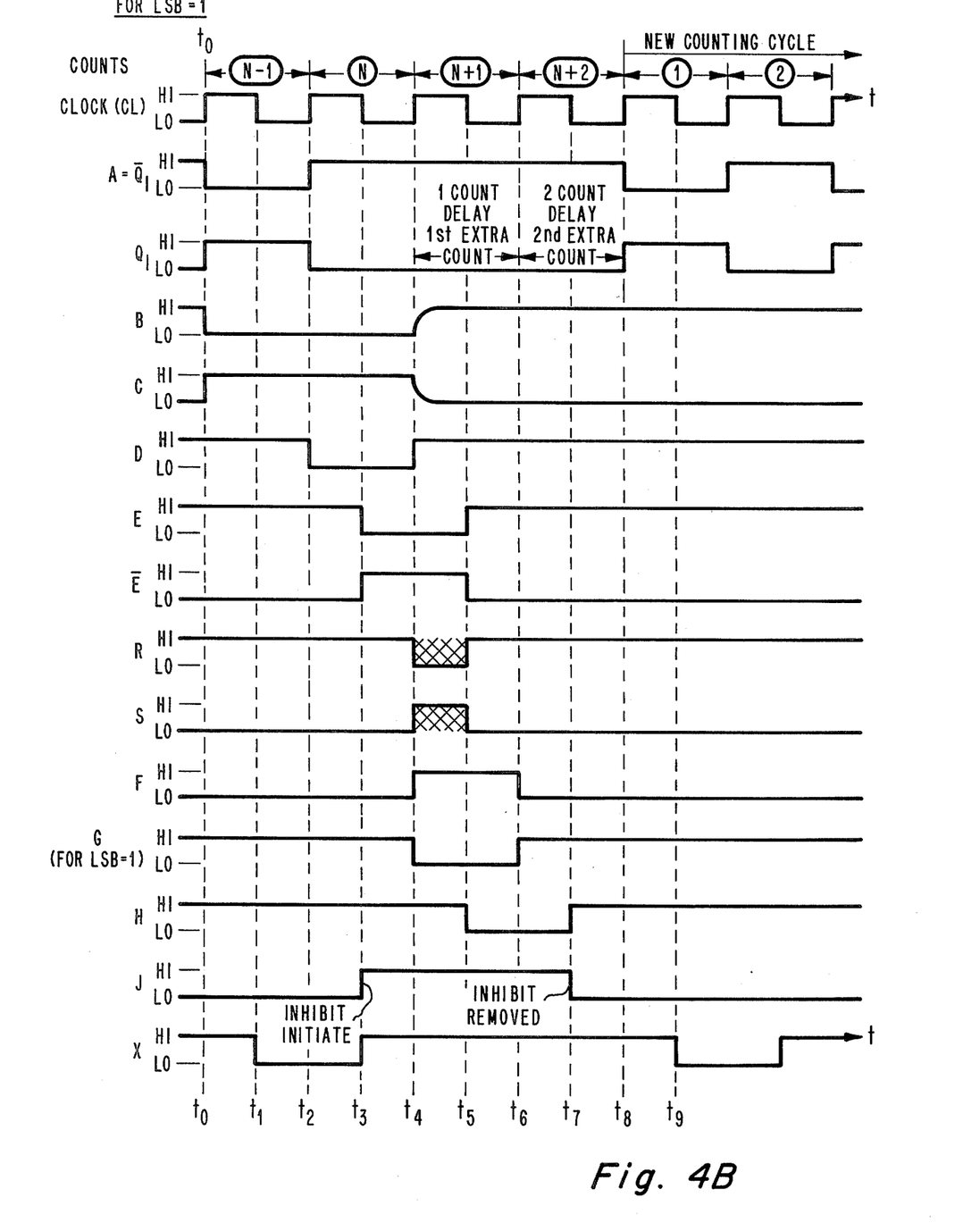

The operation of the circuit of FIG. 3 and, in particular, the operation of counter 40 may best be understood by reference to the waveform diagrams of FIGS. 4A and 4B.

The signal at A of the first stage 33 in the absence of an inhibit (INH) signal, varies at one half the rate of CL and changes state when CL makes a positive going transition.

Assume, as shown in FIG. 4A, that at $t=t_0$: (1) the clock goes high, A goes low, $Q_1$ goes high ($\overline{Q}_1$ goes low); and (2) B goes to zero indicative that stages 2-to-K of counter 35 have counted down to zero. B is applied to one input of two input NOR gate NR1 whose other input (F) is low. Hence, C, the output of NR1, goes high.

The states of the stages 1 through K of counter 35 are sensed by means of NAND gate ND1 whose first input (1) is connected to node A and whose second input (2) is connected to the output C of NOR gate NR1. At time $t=t_2$, CL goes positive, A goes positive, and $Q_1$ goes to zero indicative that all the stages of counter 35 are now at zero.

With A and C high, the output D of ND1 goes low. This effectively initiates the flow of a pulse in the auxiliary counting loop. When D goes low, transistor P1, which provides positive feedback, is turned on and clamps node A and input 1 of ND1 to the high condition. At $t_3$, CL makes a negative going transition and the "low" at D is transferred via TG4 to node E. E "low" applied to one input (1) of NAND gate ND3 causes the output J of ND3 to go high. J-high causes the P and N transistors of TG3 to be turned off, which inhibits the further transmission of data through TG3. Thus, within half-a-cycle (at $t_3$) of all the stages of counter 35 having counted down to zero the first stage is inhibited before it can change state and the master is decoupled from the slave.

At time $t=t_4$, CL goes positive, and since E is high, the output, R, of ND4 goes low: R-low applied to the input of inverter I6 causes its output, S, to go high. S is applied to reset circuitry 37 which then places stage 2-to-K of counter 35 in preselected states. Also, at $t_4$, $\overline{E}$ high is transferred via TG5 to node F, causing F to go high. F high applied to the second input of NR1, causes C to go low and D to go high, which turns off transistor P1. Feeding F-high back to NR1 allows only one reset pulse (R-S) to be generated per counting cycle. If F were not fed back to NR1, more than one reset pulse could occur if the higher order stages did not reset quickly enough. Since F is high for a full half clock cycle after the reset pulse has terminated, the generation of another reset pulse is clocked until sufficient time is provided to allow B to go back high.

For LSB set to zero, the outputs G of ND2 and H of TG6 remain high and ND3 functions to invert the signal E applied to its (1) input. At $t=t_5$ the "high" at D is transferred via TG4 to E. E high applied to ND3 causes J to go low and R to go high, which terminates the inhibit and the reset pulses. Since at $t_5$ CL goes negative, the first stage cannot change state until half a cycle later at time $t_6$. At $t_6$, $\overline{E}$ low causes F to go low and to remain low. This reestablishes the condition originally assumed for $F=0$ at $t_0$. At $t_6$ the counter 35 is ready to begin counting again. Thus, for LSB=0 the auxiliary counter 40 has counted one cycle and has delayed the counter 35 by one count. For example, if the desired division were 16, the counter 35 could be set to count up to 15 and LSB would be set to zero. The auxiliary counter 40 would count 1 clock pulse per cycle of 15 counts in counter 35 and a total count of 16 (N+m) would be generated.

For LSB set to the "1" level, the inhibit signal to TG3 is applied for two full cycles of the clock. The operation of the circuit differs from that described for LSB=0 in that, as shown in FIG. 4B, at time $t_4$ the output G of ND2 goes low in response to F going high. At $t_5$, E goes high, as described above, but F remains high and G low. The negative transition of CL at $t_5$ enables TG6 and the low at G is transferred to H, maintaining J high and TG3 inhibited. At time $t_6$, G goes high but TG6 is disabled and hence H remains "low" until $t_7$, causing J to remain high and gate TG3 inhibited. At $t_7$, TG6 is enabled and G high causes H to go high. Since G and E are already high, the three inputs to ND3 are high and J goes low, removing the inhibit of TG3. TG3 which had been inhibited since $t_3$ is now turned on and remains on. Since at $t_7$ CL goes negative, TG2 is turned off and there is no change in the levels of the first stage. It is only at $t_8$ when CL goes positive that a new counting cycle is initiated. Thus, a full half-cycle passes after TG3 is turned-on before it has to conduct. At $t_8$, TG2 is enabled and the low output (inverse of X) of the master inverter I1 is coupled to the input A of the slave which causes A to change from high to low. Thus, for LSB=1 the change at A is delayed for two cycles of the clock.

Important features of the counting arrangement of FIG. 3 are as follows:

1. The speed of a divide-by-N counter chain depends mainly on the characteristics of the first stage delay.

2. Dynamic counters are faster than static counters.

3. In the first stage when a zero condition is detected, it is automatically known that the next clock pulse will result in the state being set to "one", if nothing is done. It is only if the stage is to be held at zero (i.e. a zero is to be jammed into the stage) that action is required. This action is termed "partial resetting" since the outputs of the stage are already in the desired state and action must be taken to prevent a change in the state.

4. The necessary partial resettability for the first stage can be obtained by an inhibitable counter stage or a resettable counter stage. In inhibitable counting, the counter is prevented from changing state. This is faster than resetting the various transistors in a counter stage since resetting requires that voltage levels be changed, and that the transistors be made to change state; delay is inherent in such a process.

5. In order to allow one full clock period in which to jam (Preset or Reset) the slower, higher order stages 2 through K, of counter 35, the inhibit is maintained for either 1 or 2 clock periods. This avoids the need for state detection and presetting during the same one clock period.

It should be appreciated that additional delays can be provided in the shift register loop by the addition of suitable transmission gates and inverters to the shift register (auxiliary counting) loop and by applying appropriate outputs to gate ND3 or an equivalent gate to maintain J high for the additional period. Also, instead of a shift register, other counting circuits could be introduced in the auxiliary counting loop. Thus, although m is shown to be 1 or 2, it could be increased.

PMOS latch transistor P1, which is optional, is employed to restore a clean zero in the dynamic counter. In a breadboarded circuit, it was found that the use of P1 increased counting speed by about 20%. As the highest counting rate is approached, the inhibit gate TG3 tends to turn off late. The latching path of the source-to-drain path of transistor P1, which has less delay that the generation of the inhibit control signal, holds the counter at zero until the inhibit signal arrives.

Figure 5:
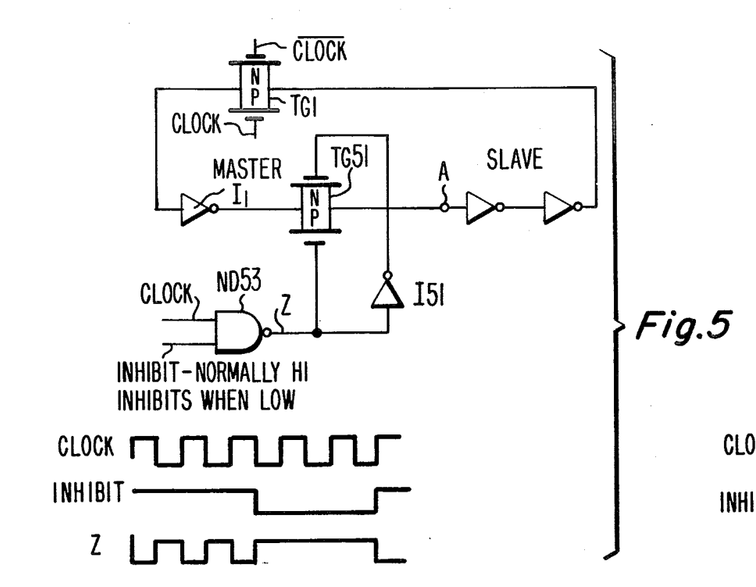
FIGS. 5 and 6 are other schematic diagrams of inhibitable dynamic counters embodying the invention.
Figure 6:
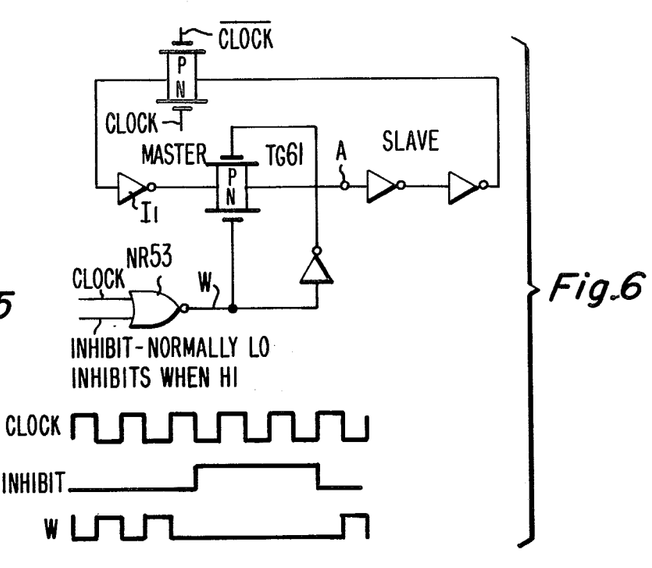

FIGS. 5 and 6 illustrate an inhibitable dynamic counter stage in which a single transmission gate TG51 is connected between the output of the master I1 and the input A to the slave section of the counter stage. A clocking signal is applied to the transmission gate in the absence of an inhibit signal (i.e. in FIG. 5 when the inhibit is high and in FIG. 6 when the inhibit is low). In the presence of an inhibit signal (low in FIG. 5, high in FIG. 6) the transmission gate TG51 is turned-off and the transfer of signal from the master to the slave is inhibited. The state at the input to the slave section is then maintained unchanged for the length of time the transmission gate is inhibited In FIG. 5 the clock signal and the inhibit input are applied to the two inputs of NAND gate ND53. The output Z of ND53 is applied to the control electrode of the P transistor of TG51 and to the input of inverter I51 whose output is applied to the control electrode of the N transistor of TG51. When the inhibit input is high, the output Z is the complement of the clock and the counter stage operates in a normal fashion. That is, when the clock is high there is transfer of signal through TG51 from the master to the slave and when the clock is low there is transfer of signal through TG1 from the output of the slave to the input of the master. When the inhibit is low, the output Z is forced high and the output of I51 goes low, turning off TG51 and inhibiting transfer of data between the master and slave.

In FIG. 6, the clock and the inhibit input are applied to the two inputs of NOR gate NR53. The output W of NR53 is applied to the gate electrode of the N transistor of TG61, and the complement of W is applied to the gate electrode of the transistors of TG61. For this configuration, the clock signal is applied to TG61 when the inhibit is low, and the clock signal is inhibited and TG61 is turned off when the inhibit input is high.

Figure 7B:
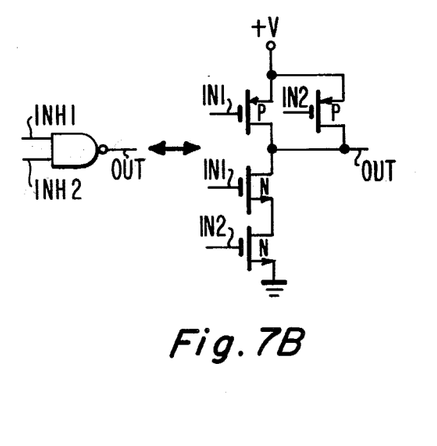
Figure 7C:
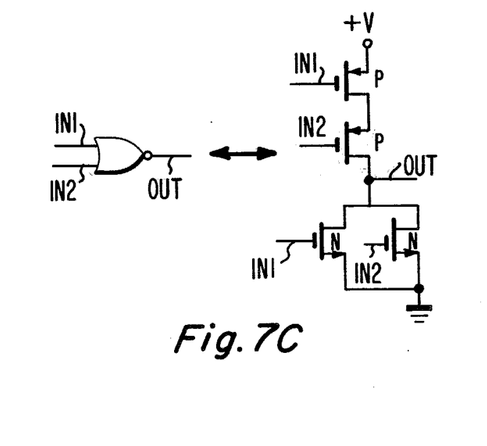

FIGS. 7A, 7B and 7C illustrate the use of insulated-gate field-effect transistors of complementary conductivity type to form of the logic gates employed in the circuits of the FIGURES. Although any logic gates may be used to practice the invention, complementary circuitry provides many advantages because of its low power dissipation and high noise immunity. FIG. 7A is a complementary inverter. FIG. 7B is a two-input NAND gate. FIG. 7C is a two input NOR gate.

Figure 8A:
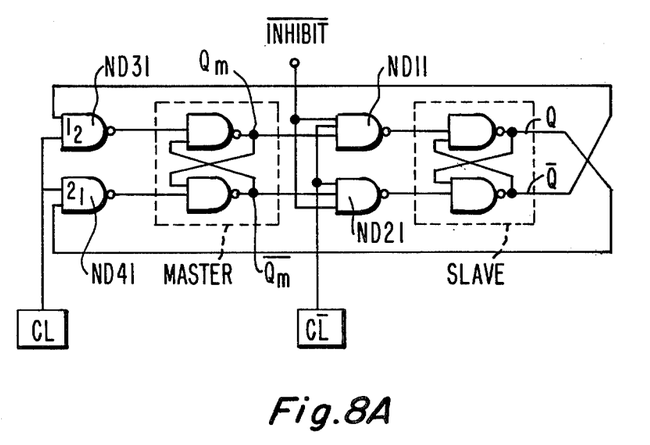
Figure 9A:
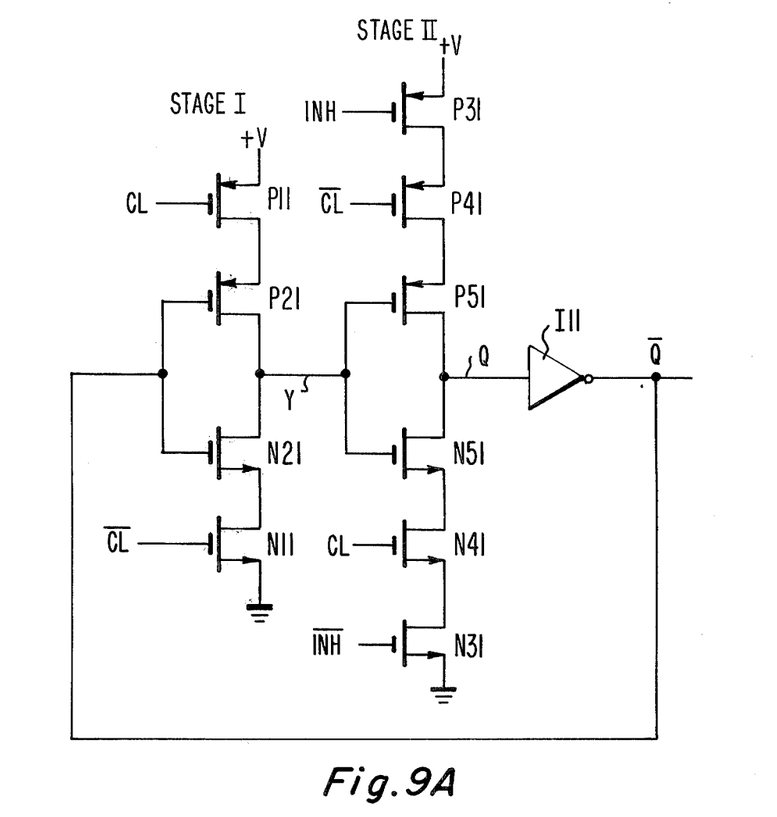
FIG. 9A is a schematic diagram of still another inhibitable counter embodying the invention.

FIGS. 8 and 9 illustrate types of inhibitable counter stages which do not use transmission gates.

Figure 8B:
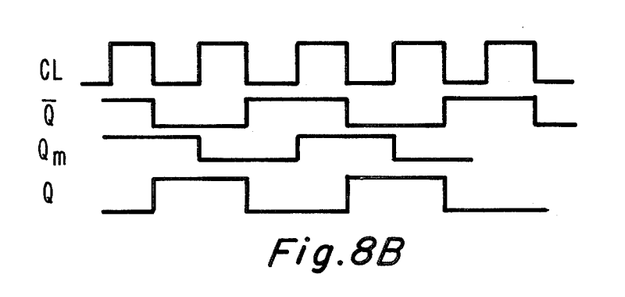
FIGS. 8B and 9B are waveforms useful in understanding the operation of the FIGS. 8A and 9A counters.

FIG. 8A shows an inhibitable static master-slave flip-flop which may be formed with conventional logic gates. Each one of the master and the sleeve sections includes two, cross-coupled, two-input NAND gates. The outputs Qm and $\overline{Qm}$ of the master are respectively connected to the one (1) inputs of three input NAND gates ND11 and ND21, whose outputs are connected to the inputs of the slave. The two other inputs to each one of ND11 and ND21 are an $\overline{INHIBIT}$ signal and the $\overline{CL}$ signal. Q and $\overline{Q}$ outputs of the slave are, respectively, connected to the one (1) inputs of two-input NAND gates ND41 and ND31 whose outputs are connected to the inputs of the master. The clock (CL) is applied to the other inputs of ND31 and ND41. As shown in FIG. 8B, the outputs Qm (and $\overline{Qm}$ not shown) changes state when CL goes positive and Q and $\overline{Q}$ change state when CL goes negative and as long as the $\overline{INHIBIT}$ is positive. When the $\overline{INHIBIT}$ signal goes negative, the transfer of information between the master and slave is inhibited while the clock can run continuously. Thus, circuits embodying the invention may be fabricated without using transmission gates. It should be evident that any one of a number of known circuits may be used to implement the logic circuit of FIG. 8A.

FIG. 9A includes a first stage I comprised of an inverter (P21, N21) to which power is periodically applied (when CL is low and $\overline{CL}$ is high) by means of switches P11, N11. A second stage II includes an inverter (P51, N51) to which power is periodically applied (when CL is high) via switches P41, N41 when the inhibit (INH) is low and switches P31 and N31 are turned on. The output of stage I changes state whenever CL goes negative. The output Q of the second stage II changes state whenever CL goes positive and the INHIBIT signal (INH) is low. The output $\overline{Q}$ of the second stage is fed back via an inverter I11 to the input of the first stage.

Figure 9B:
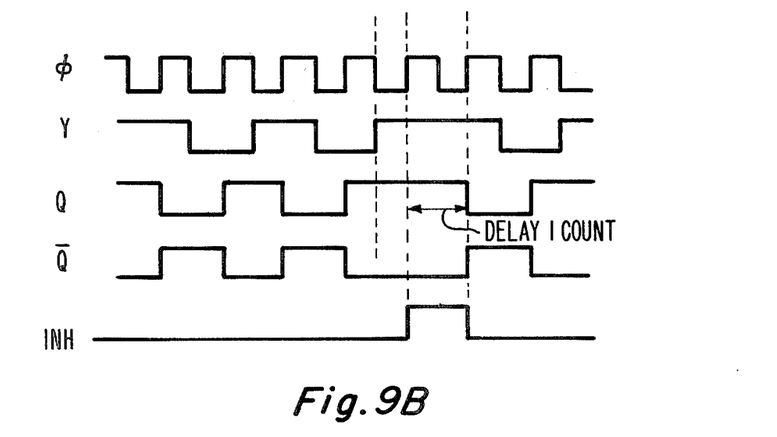

As illustrated in the waveforms of FIG. 9B the counter may be inhibited from counting by the application of a positive INH signal to the gate of transistor P31 and a negative $\overline{INH}$ signal to the gate of transistor N31.

What is claimed is:
1. The combination comprising:
a counter stage including:
(a) first and second sections, each section having an input and an output, one of said first and second sections producing at its output a signal which is 180° out-of-phase with a signal at its input, and the other one of said first and second sections producing at its output a signal in-phase with the signal at its input;
(b) first gating means connected between the output of said first section and the input of said second section; said first gating means being responsive to cyclical signals and inhibit signals; and
(c) second gating means connected between the output of said second section and the input of said first section;
a source of cyclical signals having first and section portions per cycle;
first means applying said cyclical signals to said first gating means for, in the absence of an inhibit signal, enabling said first gating means for transferring the output of said first section to the input of said second section during said first portion of each cycle, and for disabling said first gating means during the second portion of each cycle;

second means applying said cyclical signals to said second gating means for enabling said second gating means for transferring the output of said second section to the input of said first section during said second portion of each cycle, and for disabling said second gating means during the first portion of each cycle; and third means, including counting means, responsive to a predetermined number of pulses produced at the output of at least one of the sections of said counter stage, for producing an inhibit signal and applying it to said first gating means for inhibiting the transfer of information from said first section to said second section, for thereby preventing a change at the input and at the output of said second section for a given number of cycles of said cyclical signals.

2. The combination as claimed in claim 1 wherein said first gating means includes a first transmission gate and said second gating means includes a second transmission gate;

wherein each one of said transmission gates includes a conduction path and a control element;

wherein the conduction path of said first transmission gate is connected between the output of the first section and the input of the second section, and the conduction path of said second transmission gate is connected between the output of the second section and the input of the first section;

wherein said first and third means applying said cyclical and inhibit signals, respectively, to said first gating means includes a logic gate having one input responsive to said cyclical signals, having another input to which said inhibit signal is applied; and having an output connected to the control element of said first transmission gate; and wherein said second means includes means for applying said cyclical signal to the control element of said second transmission gate.

3. The combination as claimed in claim 1 wherein said first gating means includes first and second transmission gates and wherein said second gating means includes a third transmission gate;

wherein each one of said transmission gates includes a conduction path and a control element;

wherein the conduction paths of said first and second transmission gates are connected in series between the output of said first section and the input of said second section; and wherein the conduction path of said third transmission gate is connected between the output of said second section and the input of said first section.

4. The combination as claimed in claim 3, wherein one end of the conduction path of said first transmission gate is connected to the output of said first section and wherein the conduction path of said second transmission gate is connected between the other end of the first transmission gate and the input of said second section, and wherein said first means coupled to said first gating means includes means for applying the cyclical signal to the control element of said first transmission gate; wherein said third means includes means for applying the inhibit signal to the control element of said second transmission gate; and wherein said second means includes means for applying said cyclical signal to the control element of said third transmission gate.

5. A counter stage comprising:

first and second sections, each section having an input and an output, said first section producing at its output a signal which is 180° out-of-phase with a signal at its input, and said second section producing at its output a signal in-phase with the signal at its input;

gating means operatively connected between said first and second sections for alternately transferring the output of said first section to the input of said second section and the output of said second section to the input of said first section for producing pulses at the outputs of said sections; and means, including counting means responsive to a predetermined number of pulses produced at the output of at least one of said sections, operatively connected to said gating means for selectively inhibiting the transfer of information between said first and second sections, thereby preventing a change at the input and at the output of at least one of said first and second sections.

6. The combination as claimed in claim 5 wherein said gating means is adapted to receive cyclical signals having a first value for one time interval and a second value during a second succeeding time interval; said gating means being responsive to said cyclical signals for transferring data from said first section to said second section when said cyclical signals have said first value and transferring data from said second section to said first section when said cyclical signals have said second value; and wherein said means for selectively inhibiting is adapted to receive an inhibit signal, and in response thereto inhibits the transfer of information between said first and second sections for the duration of said inhibit signal.

7. The combination as claimed in claim 5 wherein said gating means includes first and second transmission gates and wherein said means for selectively inhibiting includes a third transmission gate;

wherein each one of said transmission gates includes a conduction path and a control element;

wherein the conduction paths of said first and third transmission gates are connected in series between the output of one of said first and second sections and the input of the other one of said first and second sections; and wherein the conduction path of said second transmission gate is connected between the output of said other one of said first and second sectons and the input of said one of said first and second sections.

8. The combination as claimed in claim 7 wherein said gating means is adapted to receive cyclical signals having a first binary significance during a first portion of each cycle and a second binary significance during a second portion of each cycle;

wherein said signals are continuously applied to the control elements of said first and second transmission gates for continuously and alternately turning them on and off; and wherein said means for selectively inhibiting the transfer of information includes means applying an inhibit signal to the control element of said third transmission gate for normally enabling it and selectively disabling it.

9. The combination as claimed in claim 8 wherein said first section includes a single inverter;
   wherein said second section includes two inverters connected in cascade between said input and output of said second section;
   wherein the conduction paths of said first and third transmission gates are connected between the output of said first section and the input of said section section; and
   wherein the conduction path of said second transmission gate is connected between the output of the second section and the input of the first section.

10. The combination as claimed in claim 8 wherein said first section includes a first inverter connected between the input and output of said first section and a second inverter connected via a fourth transmission gate between the output and input of said first section to provide positive feedback to said first inverter, and
   wherein said second section includes two inverters connected in cascade between said input and said output of said second section and a fifth transmission gate connected between said output and said input of said second section for selectively providing positive feedback therebetween.

11. The combination as claimed in claim 5 wherein said first section includes first and second IGFETs of complementary conductivity type having their gates connected in common to said input point of said first section and their drains coupled to said output of said first section;
   wherein said second section includes third and fourth IGFETs of complementary conductivity type having their gates connected in common to said input of said second section and their drains coupled to an output point, and an inverter connected at its input to said output point and at its output of said output of said secnd section and to said input of said first section;
   wherein said gating means includes fifth and sixth IGFETs of complementary conductivity type having their conduction paths connected in series with the conduction paths of said first and second IGFETs, and seventh and eighth IGFETs of complementary conductivity type having their conduction paths connected in series with the conduction paths of said third and fourth IGFETs; and wherein said gating means also includes means coupled to the gates of said fifth, sixth, seventh, and eighth IGFETs for alternately turning-on said fifth and sixth IGFETs and turning-off said seventh and eighth IGFETs during one time interval, and for turning-off said fifth and sixth IGFETs and turning-on said seventh and eighth IGFETs during a succeeding time interval; and
   wherein said means for selectively inhibiting includes normally conducting ninth and tenth IGFETs having their conduction paths connected in series with said third, fourth, seventh and eighth IGFETs; and means responsive to an inhibit signal coupled to the gates of said ninth and tenth IGFETs for selectively preventing conduction and a change in the outputs of said second section.

12. A K stage counter stage comprising:
a source of cyclical signals to be counted;
a first stage having first and second sections, each section having an input and an output, said first section producing at its output a signal which is 180° out-of-phase with a signal at its input, and said second section producing at its output a signal in-phase with the signal at its input;
gating means operatively connected to said first and second sections and responsive to said cyclical signals for alternately transferring the output of said first section to the input of said second section and the output of said second section to the input of said first section;
K−1 additional counting stages interconnected to count the output of said first stage, where K is an integer greater than 1; and
means for detecting a predetermined condition of said first and K−1 stages and means responsive thereto for producing an inhibiting signal applied to said first stage for inhibiting the transfer of information between said two sections of said first stage for a preselected number of said cyclical signals.

13. The combination as claimed in claim 12 wherein said means for detecting a predetermined condition of said first and K−1 stages includes a logic gate and wherein said means responsive thereto includes a counting means which when enabled is capable of counting a selected number of said clock signals; wherein the output of said logic gate is coupled to said counting means for enabling said counting means when said predetermined condition is reached, and
   wherein said counting means maintains said inhibiting signal applied to said first stage for said selected number of said clock signals.

14. A K stage divide-by-N counter, where K and N are integers greater than 1, comprising:
   a first stage having a master section and a slave section and including normally, cyclically, enabled transmission means coupled between the master and the slave which, when enabled allows the transfer of information between the two sections;
   K−1 additional counting stages interconnected to count the output of said first stage; and
   means for detecting a predetermined condition of said first and said K−1 stages and in response thereto producing an inhibiting signal applied to said transmission means for selectively disabling said transmission means and preventing the transfer of information between said two sections.

15. The combination as claimed in claim 14 wherein said counting stages includes, means for presetting said K−1 stages to a desired count; and wherein said inhibiting signal disables said transmission means for at least the minimum period of time necessary to preset said K−1 stages to said desired count.

16. The combination comprising:
first and second sections; said first section including first and second cross-coupled NAND gates, the outputs of the first and second NAND gates being the logical complement of each other, and being defined as $Q_M$ and $\overline{Q}_M$, respectively; said second section including third and fourth cross-coupled NAND gates, the outputs of said third and fourth NAND gates being the logical complement of each other, and being defined as Q and $\overline{Q}$, respectively;
first gating means including fifth and sixth NAND gates connected between the outputs of the NAND gates of said first section and the inputs to the NAND gates of said second section;
second gating means including seventh and eighth NAND gates connected between the outputs of the NAND gates of said second section and the inputs to the NAND gates of said first section;

a source of cyclical signals having first and second portions per cycle;

an inhibit signal having either a first value or a second value;

means applying said cyclical signals and said inhibit signal to said first gating means for enabling said first gating means and transferring the outputs $Q_M$ and $\overline{Q}_M$ of the NAND gates of the first section to the inputs of the NAND gates of the second section during said first portion of each cycle and when said inhibit signal has said first value; and for inhibiting the transfer of information from said first section to said second section and preventing a change at the input and at the output of said second section during the transition of said inhibit signal from said first to said second value and when said inhibit signal has said second value; and means applying said cyclical signals to said second gating means for enabling said second gating means and transferring the outputs $Q$ and $\overline{Q}$ of the NAND gates of said second section to the inputs of the NAND gates of said first section during said second portion of each cycle.

17. The combination comprising:

first and second sections, each section having an input and an output, one of said first and second sections producing at its output a signal which is 180° out-of-phase with a signal at its input, and the other one of said first and second sections producing at its output a signal in-phase with the signal at its input;

first and second transmission gates, each transmission gate having a conduction path and a control electrode;

means connecting the conduction path of said first transmission gate between the output of the first section and the input of the second section;

means connecting the conduction path of said second transmission gate between the output of the second section and the input of the first section;

a first point for receiving a cyclical signal having first and second portions per cycle, and a second point for receiving an inhibit signal having first and second values;

means, including a logic gate responsive to said inhibit signal and to said cyclical signal, connected to said first transmission gate for, when said inhibit signal has said first value, enabling said first transmission gate and transferring the output of the first section to the input of said second section during said first portion of each cycle; and for, when said inhibit signal has said second value, disabling said first transmission gate and inhibiting the transfer of information from said first section to said second section whereby there is no change at the input and at the output of said second section; and means responsive to said cyclical signal, connected to said second transmission gates, for applying said cyclical signal to the control electrode of said second transmission gate for transferring the output of said second section to the input of said first section during said second portion of each cycle.

* * * * *

UNITED STATES PATENT AND TRADEMARK OFFICE
CERTIFICATE OF CORRECTION

PATENT NO. : 4,182,961

DATED : January 8, 1980

INVENTOR(S) : Andrew G. F. Dingwall

It is certified that error appears in the above-identified patent and that said Letters Patent is hereby corrected as shown below:

Col. 2, line 45 "settling" should be --- setting ---.

Col. 5, line 56 "E" should be --- $\overline{E}$ ---.

Col. 6, line 2 "clocked" should be --- blocked ---.

Col. 8, line 5 "sleeve" should be --- slave ---.

Col. 11, line 37 "secnd" should be --- second ---.

Signed and Sealed this

Twenty-second Day of April 1980

[SEAL]

Attest:

SIDNEY A. DIAMOND

Attesting Officer

Commissioner of Patents and Trademarks